(12) United States Patent
Terabayashi

(10) Patent No.: US 9,786,381 B2
(45) Date of Patent: Oct. 10, 2017

(54) SEMICONDUCTOR MEMORY DEVICE THAT DETERMINES A DETERIORATION LEVEL OF MEMORY CELLS AND AN OPERATION METHOD THEREOF

(71) Applicant: Toshiba Memory Corporation, Tokyo (JP)

(72) Inventor: Yoshiki Terabayashi, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/232,791

(22) Filed: Aug. 9, 2016

(65) Prior Publication Data

US 2017/0169895 A1 Jun. 15, 2017

(30) Foreign Application Priority Data

Dec. 14, 2015 (JP) ................. 2015-243424

(51) Int. Cl.
*G11C 7/00* (2006.01)
*G11C 16/34* (2006.01)
*G06F 3/06* (2006.01)
*G11C 16/08* (2006.01)
*G11C 16/26* (2006.01)
*G11C 29/12* (2006.01)

(52) U.S. Cl.
CPC .......... *G11C 16/349* (2013.01); *G06F 3/0619* (2013.01); *G06F 3/0647* (2013.01); *G06F 3/0653* (2013.01); *G06F 3/0679* (2013.01); *G11C 16/08* (2013.01); *G11C 16/26* (2013.01); *G11C 29/12* (2013.01)

(58) Field of Classification Search
CPC .......... G11C 7/1006; G11C 7/14; G11C 7/062
USPC ................. 365/189.15, 189.07, 236, 185.18
See application file for complete search history.

(56) References Cited

U.S. PATENT DOCUMENTS

| 7,046,555 | B2 | 5/2006 | Lutze et al. |
| 8,804,435 | B2 | 8/2014 | Matsunaga |
| 2008/0239820 | A1* | 10/2008 | Wang ............... G11C 8/08 365/185.17 |
| 2011/0141825 | A1 | 6/2011 | Hatanaka et al. |

FOREIGN PATENT DOCUMENTS

| JP | 2007-220249 A | 8/2007 |
| JP | 2013-122793 A | 6/2013 |

* cited by examiner

*Primary Examiner* — Son Dinh
(74) *Attorney, Agent, or Firm* — Patterson & Sheridan, LLP

(57) ABSTRACT

A semiconductor memory device includes a memory cell unit including a plurality of blocks, each of the blocks including a plurality of pages, and a circuit configured to count a number of activated or non-activated memory cells in one or more pages when a first voltage is applied to gates of memory cells of said one or more pages to read data therefrom, count a number of activated or non-activated memory cells in said one or more pages when a second voltage different from the first voltage is applied to the gates of the memory cells of said one or more pages to read data therefrom, compare the counted numbers, and store, in a register, data about deterioration of the memory cells of said one or more pages depending on a comparison result.

20 Claims, 9 Drawing Sheets

SEMICONDUCTOR MEMORY DEVICE THAT DETERMINES A DETERIORATION LEVEL OF MEMORY CELLS AND AN OPERATION METHOD THEREOF

CROSS-REFERENCE TO RELATED APPLICATION

This application is based upon and claims the benefit of priority from Japanese Patent Application No. 2015-243424, filed on Dec. 14, 2015, the entire contents of which are incorporated herein by reference.

FIELD

Embodiments described herein relate generally to a semiconductor memory device and an operation method thereof.

BACKGROUND

A NAND-type flash memory having floating gates is known.

DETAILED DESCRIPTION

Figure 1:
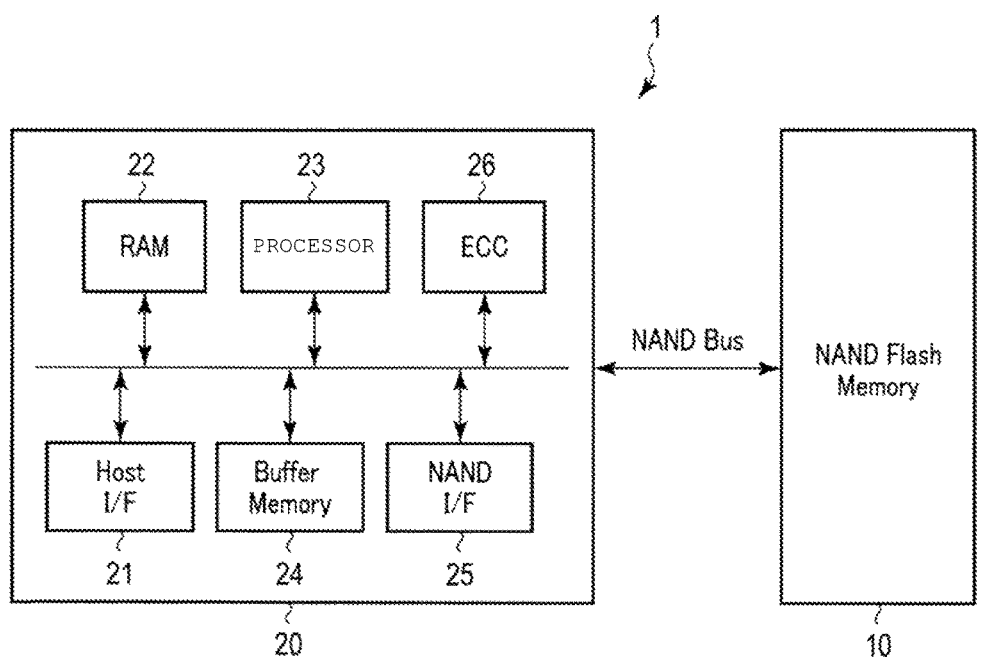
FIG. 1 is a block diagram of a memory system according to a first embodiment.

An embodiment provides a semiconductor memory device which can manage a deterioration state of memory cells and a control method thereof.

In general, according to an embodiment, a semiconductor memory device includes a memory cell unit including a plurality of blocks, each of the blocks including a plurality of pages, and a circuit configured to count a number of activated or non-activated memory cells in one or more pages when a first voltage is applied to gates of memory cells of said one or more pages to read data therefrom, count a number of activated or non-activated memory cells in said one or more pages when a second voltage different from the first voltage is applied to the gates of the memory cells of said one or more pages to read data therefrom, compare the counted numbers, and store, in a register, data about deterioration of the memory cells of said one or more pages depending on a comparison result.

Hereinafter, embodiments will be described with reference to the accompanying drawings. In the following description, the same symbols or reference numerals will be used for elements having the same functions and configurations as each other.

1. First Embodiment

A semiconductor memory device according to a first embodiment and a control method thereof will be described.

1-1. Configuration 1-1-1. Configuration of Memory System 1

First, a configuration of a memory system 1 according to the first embodiment will be described with reference to FIG. 1.

As illustrated in FIG. 1, the memory system 1 includes a semiconductor memory device 10 and a controller 20.

The semiconductor memory device 10 includes multiple memory cells, and is a NAND-type flash memory in which data are stored in a non-volatile manner.

The controller 20 instructs the semiconductor memory device 10 to read, write, erase, and the like, in response to commands of an external host apparatus. In addition, the controller 20 can instruct the semiconductor memory device 10 to perform a determination operation for determining a deterioration state of memory cells. In addition, the controller 20 manages a memory space of the semiconductor memory device 10.

As illustrated in FIG. 1, the controller 20 includes a host interface circuit 21, an incorporated memory (RAM) 22, a processor 23, a buffer memory 24, a NAND interface circuit 25, and an ECC circuit 26.

The host interface circuit 21 is connected to a host apparatus (not illustrated) through a controller bus, and is used for communication with the host apparatus. In addition, the host interface circuit 21 transmits commands and data which are received from the host apparatus to the processor 23 and the buffer memory 24, respectively. In addition, the host interface circuit 21 transmits data stored in the buffer memory 24 to the host apparatus in response to a command of the processor 23.

The incorporated memory 22 is a semiconductor memory such as a DRAM, and is used as a work area of the processor 23. In addition, the incorporated memory 22 retains firmware for managing the semiconductor memory device 10, various management tables, or the like.

The processor 23 controls operations of the controller 20. For example, when receiving a write command from the host apparatus, the processor 23 issues a write command in response to the write command. A read operation, an erasure operation, and a determination operation are also carried out in a similar manner as the writing operation.

The buffer memory 24 temporarily retains write data or read data.

The NAND interface circuit 25 is connected to the semiconductor memory device 10 through a NAND bus, and is used for communication with the semiconductor memory device 10. In addition, the NAND interface circuit 25 transmits a command which is received from the processor 23 to the semiconductor memory device 10. In addition, when a write operation is performed, the NAND interface circuit 25 transmits data stored in the buffer memory 24 to the semiconductor memory device 10, and when a read operation is performed, the NAND interface circuit 25 transmits data read from the semiconductor memory device 10 to the buffer memory 24.

The ECC circuit 26 performs error checking and correcting (ECC) processing of data. In the ECC processing, parity is generated based on write data when data writing is performed, an error is detected by generating a syndrome from the parity when data reading is performed, and the detected error is corrected.

In the present embodiment, one semiconductor device may be configured by combining the semiconductor memory device 10 and the controller 20 in the same manner as in, for example, an SD™ card, a solid state drive (SSD), or the like.

1-1-2. Configuration of Semiconductor Memory Device 10

Next, a configuration of the semiconductor memory device 10 according to the first embodiment will be described with reference to FIG. 2.

Figure 2:
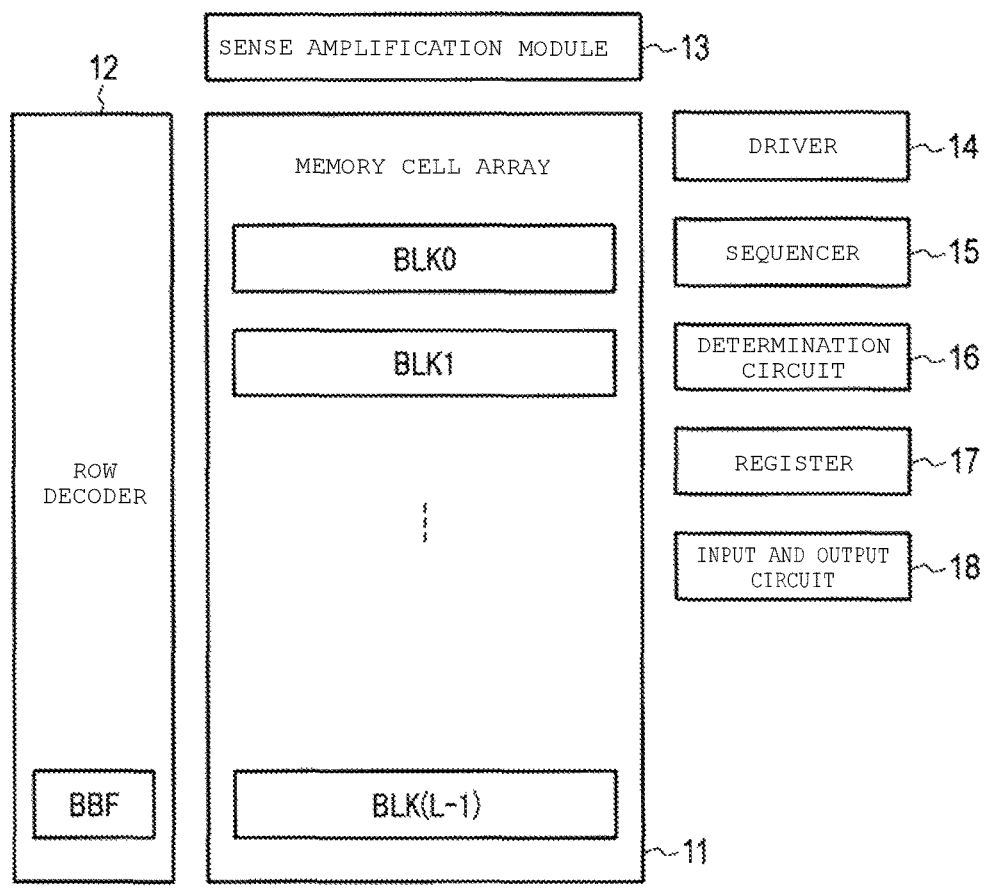
FIG. 2 is a block diagram of a semiconductor memory device of the memory system according to the first embodiment.

As illustrated in FIG. 2, the semiconductor memory device 10 includes a memory cell array 11, a row decoder 12, a sense amplification module 13, a driver 14, a sequencer 15, a determination circuit 16, a register 17, and an input and output circuit 18.

The memory cell array 11 includes multiple blocks BLK (BLK0, BLK1, . . . , BLK(L−1), (L is a natural number equal to or greater than "1")), each of which is a set of multiple non-volatile memory cells that are respectively connected to word lines and bit lines. Each of the blocks BLK is, for example, an erasure unit of data, and the data stored in each of the blocks BLK is collectively erased. Meanwhile, the number of the blocks BLK in the memory cell array 11 can be set arbitrarily. In addition, any one of the blocks BLK functions as a ROM fuse which retains information on, for example, a bad block. Information which is stored in the ROM fuse is read when power is supplied to the memory system 1.

The row decoder 12 decodes a block address and a page address, selects a word line WL connected to one of a page of the blocks BLK corresponding to the page address, and applies an appropriate voltage to the selected word line and unselected word lines. As illustrated in FIG. 2, the row decoder 12 includes an area in which a bad block flag (BBF) can be set. The BBF is set for each of the blocks BLK, and the blocks BLK to which the BBF is set in the row decoder 12 are regarded as bad blocks, thereby not being used. Meanwhile, information on a bad block is read from the ROM fuse when power is supplied to the memory system 1, and is set to a corresponding BBF. In addition, the row decoder 12 may have another configuration. The configuration of the row decoder 12 is described in, for example, U.S. patent application Ser. No. 14/191,281 filed on Feb. 26, 2014 and entitled "NON-VOLATILE SEMICONDUCTOR MEMORY DEVICE AND SEMICONDUCTOR DEVICE". In addition, the configuration of the row decoder 12 is described in, for example, U.S. patent application Ser. No. 14/014,026 filed on Aug. 29, 2013 and entitled "SEMICONDUCTOR MEMORY DEVICE". All of these patent applications are incorporated in the present specification by reference.

The sense amplification module 13 includes multiple sense amplifiers which are respectively connected to bit lines BL. The sense amplification module 13 detects data read from a memory cell to the bit line BL when data are read, and transmits write data to the bit line BL when data are written.

The driver 14 generates voltages for reading, writing, and erasing data, and supplies the voltages to the row decoder 12 and the sense amplification module 13. The voltages are applied to various wires in the memory cell array 11.

The sequencer 15 collectively controls various operations of the semiconductor memory device 10, based on external control signals and commands received from the controller 20.

The determination circuit 16 determines a deterioration state of the memory cells. This operation is called a determination operation. The determination operation and a configuration of the determination circuit 16 will be described below.

The register 17 retains various signals. For example, the register 17 retains status of a write operation or an erasure operation, and notifies the controller 20 of whether or not an operation is normally completed. In addition, the register 17 retains a command or an address which is received from the controller 20, and can also retain various tables. In addition, the register 17 can also retain determination results received from the determination circuit 16.

The input and output circuit 18 performs data communication with the controller 20 or a host apparatus. The input and output circuit 18 outputs the read data detected by the sense amplification module 13 to the outside when data are read, and transmits the write data received from the outside to the sense amplification module 13 when data are written.

1-1-3. Circuit Configuration of Memory Cell Array 11

Figure 3:
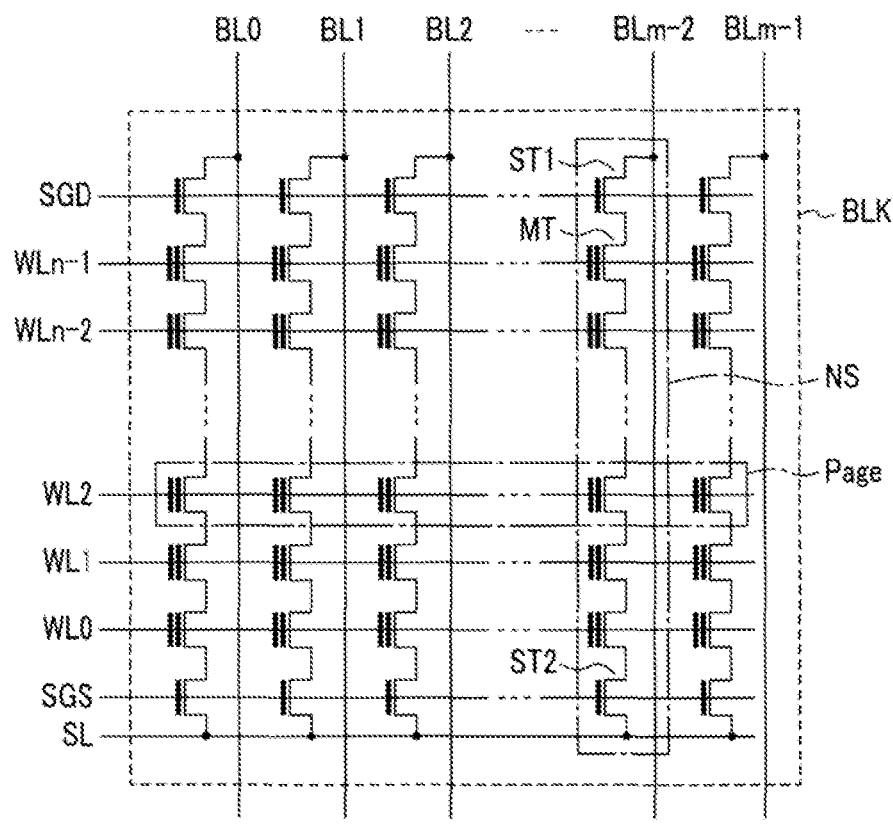
FIG. 3 is a circuit diagram of a memory cell array included in the semiconductor memory device according to the first embodiment.

Next, a circuit configuration of the memory cell array 11 according to the first embodiment will be described with reference to FIG. 3. FIG. 3 is a circuit diagram of one of the blocks BLK.

As illustrated in FIG. 3, the blocks BLK include m (m is a natural number equal to or greater than "1") NAND strings NS. Each NAND string NS includes n (n is a natural number equal to or greater than "1") memory cell transistors MT, a select transistor ST1, and a select transistor ST2.

The memory cell transistor MT includes a control gate and an electric charge accumulation layer, and retains data in a non-volatile manner. The select transistors ST1 and ST2 are used for selecting a block BLK with respect to which data reading and/or data writing is performed. One terminal of the select transistor ST1 and one terminal of the select transistor ST2 are respectively connected to one terminal and the other terminal of a serial connection of the n memory cell transistors MT. Control gates of the memory cell transistors MT which are arranged in the same row are connected in common to one of word lines WL (word lines WL0 to WL(n−1)). Gates of the select transistors ST1 and gates of the select transistors ST2 are respectively connected to select gate lines SGD and SGS in common.

In addition, in the NAND strings NS which are arranged in a matrix in the memory cell array 11, the other terminals of the select transistors ST1, which are arranged in the same column, of the NAND strings NS, are connected in common to any one of bit lines BL (BL0 to BL(m−1)). In addition, the other terminals of the select transistors ST2 are connected in common to a source line SL.

Meanwhile, data reading and data writing are collectively performed from and to the multiple memory cell transistors MT which are connected to the same word line WL. The data reading and data writing are performed in units of page.

1-1-4. Threshold Distribution of Memory Cells

Figure 4:
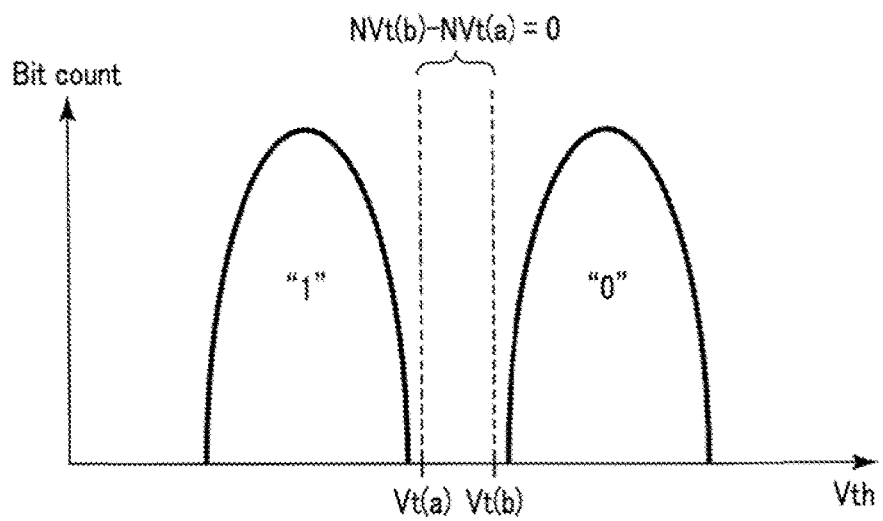
FIG. 4 illustrates threshold distribution of a memory cell that can store one-bit data.
Figure 5:
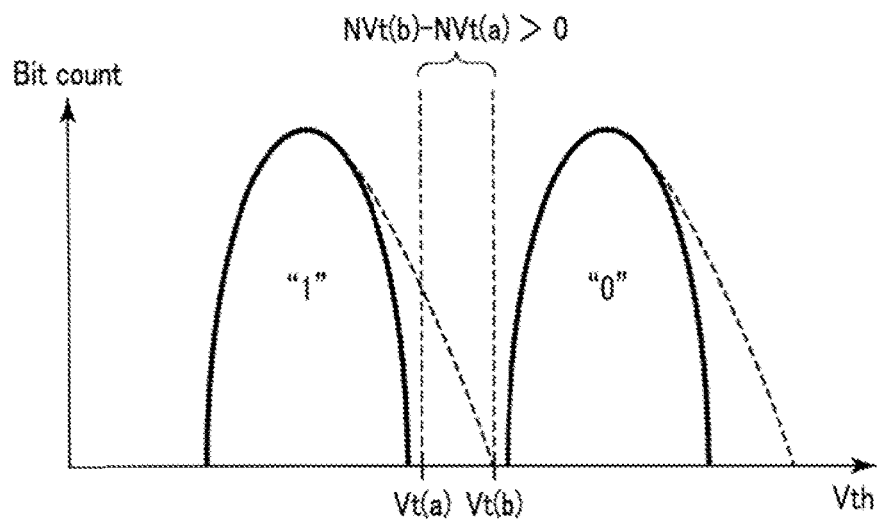
FIGS. 5 and 6 each illustrate threshold distribution of the memory cell in a deteriorated state.
Figure 6:
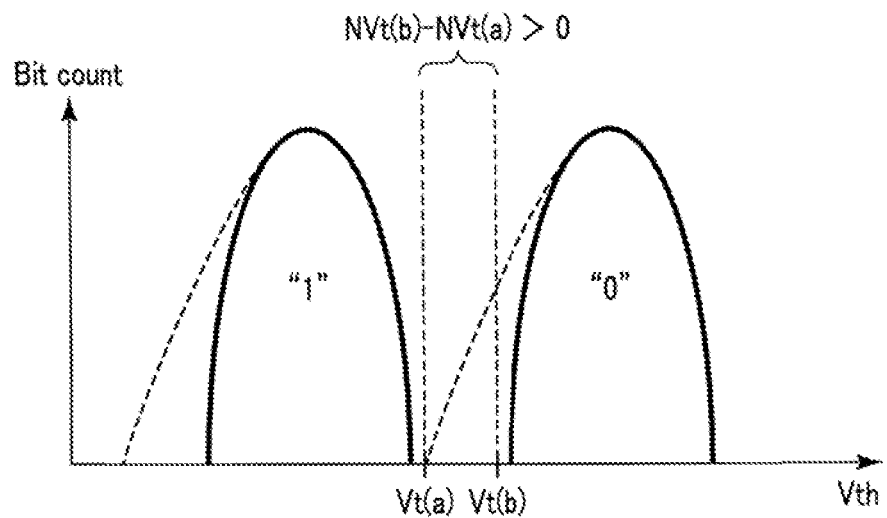

Next, threshold distribution of the memory cells will be described with reference to FIG. 4 to FIG. 6. FIG. 4 to FIG. 6 illustrate the threshold distribution of the memory cells each of which can store a binary value (one bit). Vertical axes thereof denote the number (bit number) of the memory cells, and horizontal axes thereof denote a threshold voltage Vth.

As illustrated in FIG. 4, the memory cell that can store one-bit data can take one of two threshold distributions. A low threshold distribution is in an erased state, and, for example, data "1" are assigned. Meanwhile, a high threshold distribution is in a written state, and, for example, data "0" are assigned.

When writing and erasing are repeated with respect to the memory cell, a tunnel oxide film formed between the electric charge accumulation layer of the memory cell and a channel gradually deteriorates, and capability of the electric charge accumulation layer to retain electrons decreases. When the memory cell deteriorates, the injection amount of electrons increases when data writing is performed, whereby the maximum value of each threshold distribution can increase, as illustrated in FIG. 5. In addition, when a long time passes, the electrons escape from the electric charge accumulation layer, whereby the minimum value of each threshold distribution can decrease, as illustrated in FIG. 6.

1-1-5. Configuration of Determination Circuit 16

Next, a configuration of the determination circuit 16 according to the first embodiment will be described with reference to FIG. 4 to FIG. 7.

Figure 7:
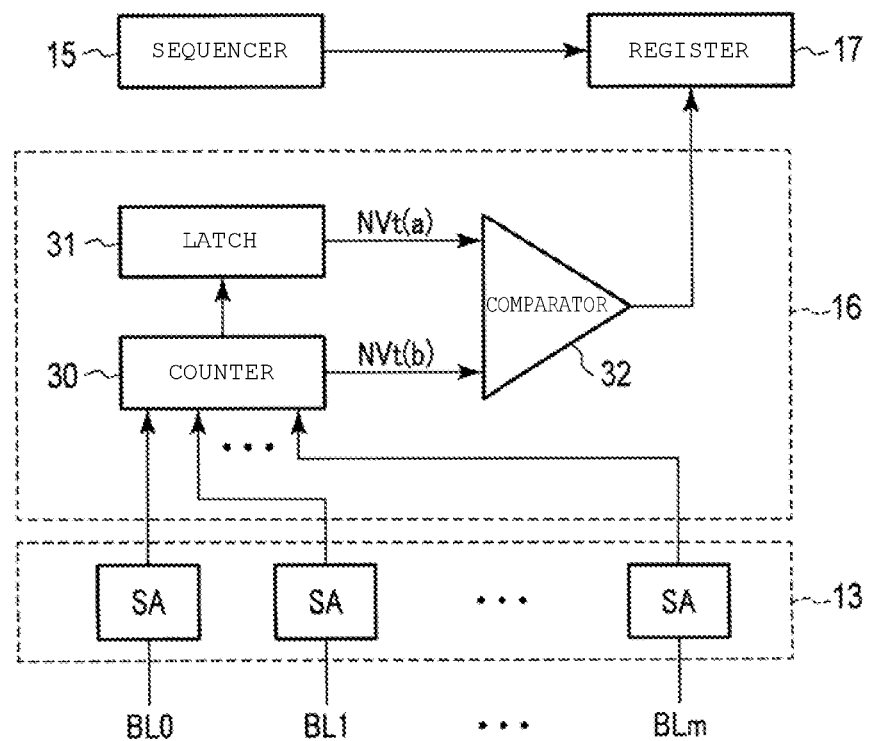
FIG. 7 is a block diagram of a determination circuit of the semiconductor memory device according to the first embodiment.

As illustrated in FIG. 7, the determination circuit 16 includes a counter 30, a latch circuit 31, and a comparator 32.

The counter 30 receives data ("0" or "1") which are detected by the sense amplifiers SA that respectively correspond to m bit lines BL, when a determination operation is performed. In addition, the counter 30 counts the number of memory cells which are activated (turned on), based on the received data, and transmits the counting results to the latch circuit 31 or inputs the counting results to a first input terminal of the comparator 32.

The latch circuit 31 retains the counting results which are received from the counter 30, and inputs the counting results to a second input terminal of the comparator 32.

The comparator 32 compares a value NVt(b) input to the first input terminal with a value NVt(a) input to the second input terminal, and transmits a comparison results to the register 17. NVt(a) and NVt(b) are respectively counting results of activated cells or deactivated cells, when a read operation of the same page is performed by read voltages Vt(a) and Vt(b). Vt(a) and Vt(b) are used for reading data of the same page, and are set based on the threshold distribution when the memory cells do not deteriorate. For example, as illustrated in FIG. 4, Vt(a) is set to a value which slightly exceeds the maximum value of the low threshold distribution, and Vt(b) is set to a value which is slightly less than the minimum value of the high threshold distribution. Here, Vt(a) is lower than Vt(b). When the memory cells do not deteriorate, the number of activated (deactivated) memory cells counted during reading with the read voltages Vt(a) and Vt(b) should not be different as illustrated in FIG. 4, and thus, NVt(b)−NVt(a)=0. When the memory cells deteriorate, the number of activated (or deactivated) memory cells counted during reading with the reading voltage Vt(b) is greater than the number of memory cells counted during reading with the reading voltage Vt(a) as illustrated in FIG. 5 and FIG. 6, and thus, NVt(b)−NVt(a)>0.

As described above, the determination circuit 16 receives the data read by the sense amplification module 13, and outputs determination results based on the input data to the register 17.

1-2. Determination Operation

Figure 8:
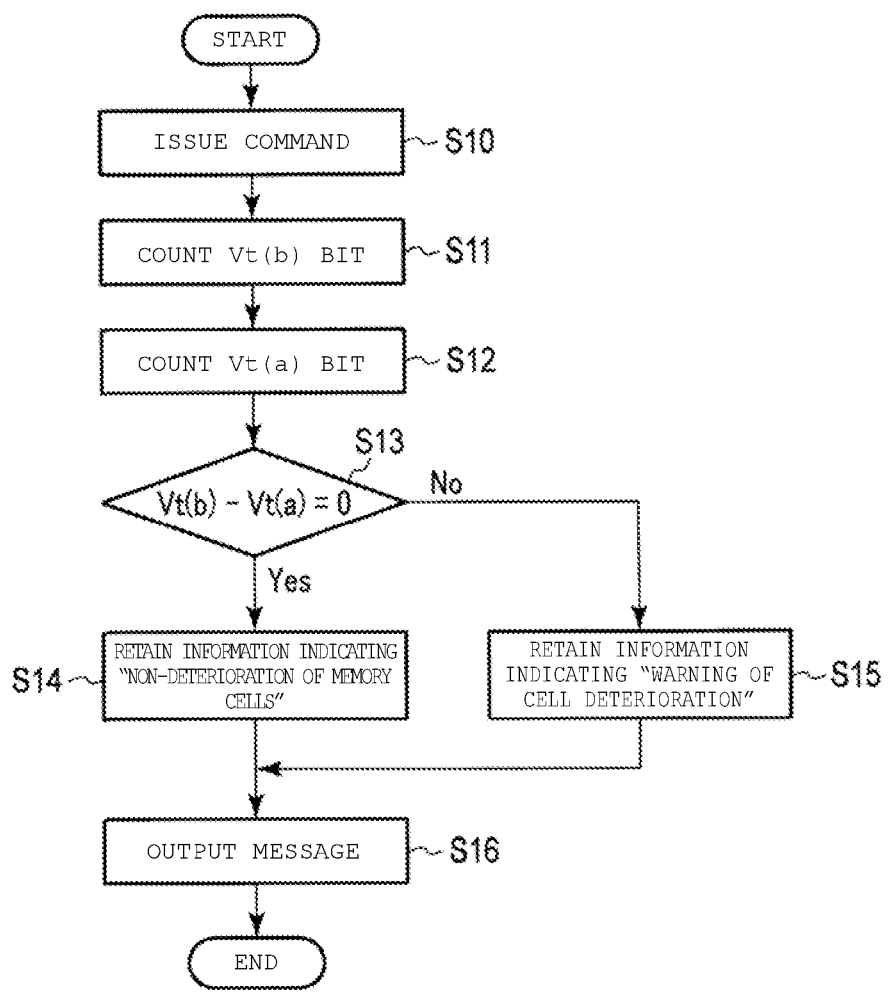
FIG. 8 is a flowchart of a determination operation carried out by the semiconductor memory device according to the first embodiment.

Next, detailed flow of the determination operation will be described with reference to FIG. 8.

In the determination operation, data of the same page is read with two types of read voltages Vt(a) and Vt(b), the numbers of memory cells which are activated memory cells are compared with each other, whereby a deterioration state of the memory cell is determined.

First, the controller 20 issues a command which indicates start of the determination operation, and the sequencer 15 controls the semiconductor memory device 10, based on the command (step S10).

Next, the row decoder 12 applies Vt(b) to a selected word line. Then, the sense amplification module 13 reads data of one page, and transmits the read data to the counter 30. Then, the counter 30 counts the number of memory cells which are activated (or deactivated), based on the read data (step S11). The counting results NVt(b) are retained in the latch circuit 31.

Subsequently, the row decoder 12 applies Vt(a) to the selected word line. Then, the sense amplification module 13 reads data of the same page as in step S11, and transmits the read data to the counter 30. Then, the counter 30 counts the number of memory cells which are activated (or deactivated), based on the read data (step S12). The counting results NVt(a) are retained in the counter 30.

Subsequently, the comparator 32 compares the counting results NVt(b) which are retained in the latch circuit 31 with the counting results NVt(a) which are retained in the counter 30 (step S13).

As a result of the comparison, when NVt(b)−NVt(a)=0 (step S13, Yes), that is, when NVt(a) is equal to NVt(b), the comparator 32 transmits information which indicates "non-deterioration of memory cells" to the register 17, and the register 17 retains the information (step S14).

Meanwhile, when NVt(b)−NVt(a)≠0 (step S13, No), that is, when NVt(a) is different from NVt(b), the comparator 32 transmits information which indicates "warning of cell deterioration" to the register 17, and the register 17 retains the information (step S15).

Subsequently, the sequencer 15 outputs information indicating "non-deterioration of memory cells" or "warning of cell deterioration" to the controller 20 or an external host apparatus, based on the information retained in the register 17 (step S16), and then, the determination operation is ended.

Meanwhile, the order in which the voltages Vt(a) and Vt(b) that are used for reading data in step S11 and step S12, respectively, are applied is not limited to this, and the order may be reversed. In this case, the number of activated memory cells is counted in step S11 during reading with the reading voltage Vt(a), and the number of activated memory cells is counted in step S12 during reading with the reading voltage using Vt(b).

Thereafter, a message indicating "warning of cell deterioration" or the like is displayed on, for example, a display unit of a host apparatus. Therefore, it is possible for a user to recognize deterioration of the semiconductor memory device.

1-3. Advantage of First Embodiment

In the NAND-type flash memory including memory cells having the electric charge accumulation layer, the tunnel oxide film of the memory cells gradually deteriorates by repeating write and erasure of data. When the tunnel oxide film deteriorates, the threshold distributions spread as illustrated in FIG. 5 and FIG. 6, and lots of abnormal reading (defective bits) can occur in the memory cells when the data reading is carried out using a normal read voltage which is set to an intermediate voltage between adjacent threshold distributions. Generally, the controller corrects the defective bits by performing error correction.

However, even though the defective bits can be corrected, when the deteriorated memory cell is continuously used, reliability of data decreases. In the related art, a host apparatus constantly needs to monitor a change of the number of defective bits, so as to check the deterioration state of the memory cells in advance.

However, the semiconductor memory device 10 according to the first embodiment performs the determination operation by using two read voltages which are set based on the threshold distribution of the memory cells before deterioration, and determines the deterioration state of the memory cells. Specifically, the semiconductor memory device 10 counts the number of activated memory cells counted during data reading with the read voltages Vt(a) and Vt(b), and compares the number of activated memory cells NVt(a) counted during the data reading with the read voltage Vt(a) with the number of activated memory cells NVt(b) counted during the data reading with the read voltage Vt(b). Thereafter, when NVt(a) is equal to NVt(b), the semiconductor memory device 10 outputs the message of "non-deterioration of memory cells" (that is, information indicating that the cells do not deteriorate) to the controller 20, and if NVt(a) is different from NVt(b), the semiconductor memory device 10 outputs the message of "warning of cell deterioration" (that is, information indicating that the cells has deteriorated) to the controller 20. That is, when the number of activated memory cells counted during the data reading with the two read voltages changes, the semiconductor memory device 10 determines that the memory cells has deteriorated, and notifies the controller 20 of the information.

Accordingly, the host apparatus can recognize the deterioration state of the memory cells, and can manage the deterioration state of the memory cells. For example, when deterioration of the memory cells is recognized, the host apparatus may operate to move the data written in the block BLK to another block BLK having small deterioration or another device, as preventative measures. In this way, it is possible to more reliably store data in the semiconductor memory device 10 by taking action with respect to the deteriorated blocks BLK.

In the present embodiment, the number of activated cells is counted during the data reading with two read voltages, to determine the deterioration state of the memory cells, in the determination operation. However, embodiments are not limited thereto, and the deterioration state of the memory cells may be determined by counting the number of deactivated cells during data reading with the two read voltages.

In addition, through the determination operation, the message may be displayed on the host apparatus, according to the determination results output from the semiconductor memory device 10 to the controller 20.

In addition, the determination operation is performed as the controller 20 issues a command in the present embodiment. However, embodiments are not limited thereto, and the semiconductor memory device 10 may spontaneously (on its own determination) perform the determination operation at an idle time without receiving a command from the controller 20.

In addition, the number of pages which are used for comparison in the determination operation is not limited to one page, and the determination operation may be performed with respect to multiple pages. In this case, a circuit which counts the number of activated cells in each of the pages while applying the same read voltage and adds the results may be included in the determination circuit 16.

In addition, when receiving a determination operation command from the controller 20, the semiconductor memory device may select one of the blocks BLK, and perform the determination operation using data read from one of the pages of the selected block BLK. At this time, the block BLK and the page thereof may be designated by addresses which are received from the controller.

In addition, when the determination operation command is received, the determination operation may be performed with respect to a plurality of blocks BLK. The semiconductor memory device 10 first selects the block BLK0, performs the determination operation with respect to the block BLK0, and transmits the determination results to the controller 20. Next, the semiconductor memory device 10 selects the block BLK1, and transmits the determination results to the controller 20. The determination operation may be performed with respect to a part of the blocks BLK or to all of the blocks BLK. When all of the blocks BLK becomes the target of the determination operation, the controller 20 can check the deterioration state of the entire memory cell array 11.

Furthermore, the semiconductor memory device 10 may perform the determination operation by selecting one or more blocks BLK to which writing and erasing are performed a predetermined number of times or more.

2. Second Embodiment

Next, a semiconductor memory device according to a second embodiment and a control method thereof will be described. According to the second embodiment, multiple deterioration levels are determined in comparison to a single deterioration level determined in the first embodiment, and a deterioration state of the memory cells are determined in more detail. Hereinafter, only the points which differ from those in the first embodiment will be described.

2-1. Configuration of Determination Circuit 16

First, a configuration of the determination circuit 16 according to the second embodiment will be described with reference to FIG. 9.

Figure 9:
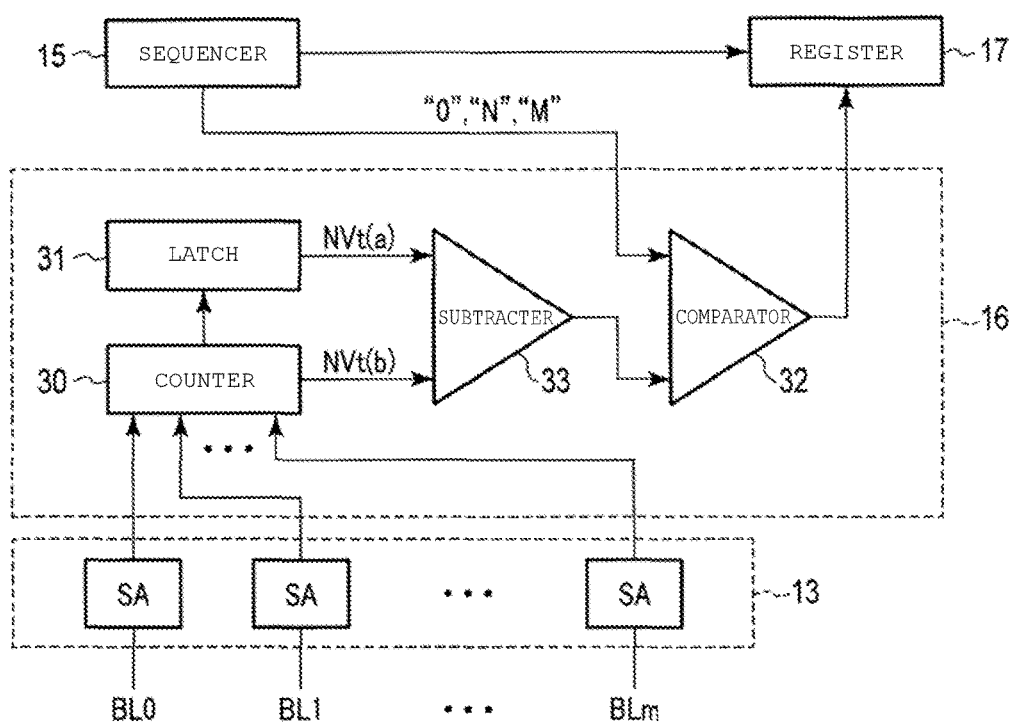
FIG. 9 is a block diagram of a semiconductor memory device according to a second embodiment.

As illustrated in FIG. 9, the determination circuit 16 further includes a subtracter 33.

The counter 30 inputs the counting results NVt(b) to a first input terminal of the subtracter 33. The latch circuit 31 inputs the counting result NVt(a) received from the counter 30 to a second input terminal of the subtracter 33.

The subtracter 33 calculates a difference between the value NVt(b) input to the first input terminal and the value NVt(a) input to the second input terminal, and transmits the calculation results to a first input terminal of the comparator 32. The comparator 32 compares the calculation results of the subtracter 33 input to the first input terminal thereof with the value issued by the sequencer 15 and input to the second input terminal thereof, and transmits the comparison results to the register 17. The other configurations are the same as those in the first embodiment.

2-2. Determination Operation

Figure 10:
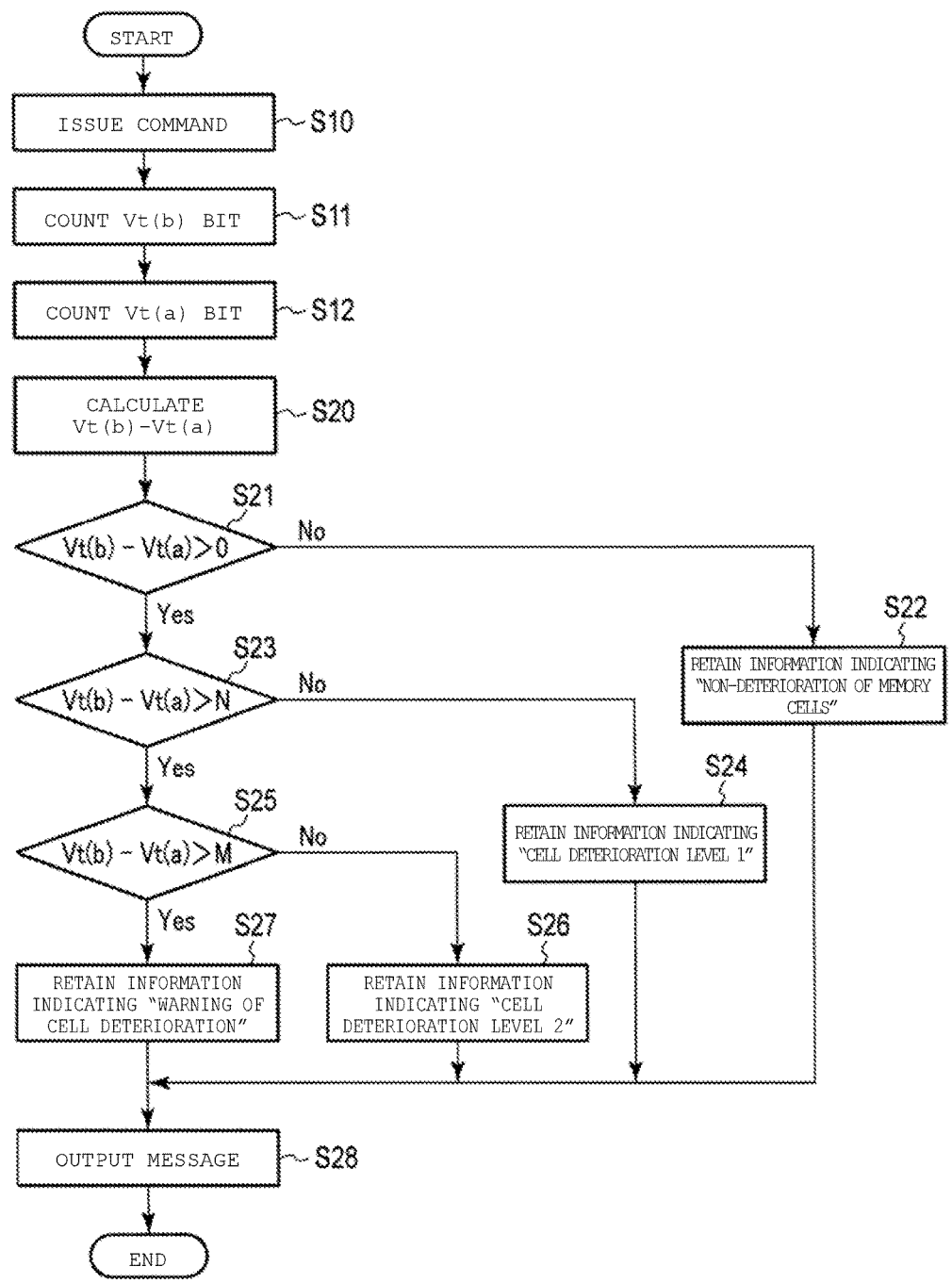
FIG. 10 is a flowchart of a determination operation carried out by the semiconductor memory device according to the second embodiment.

Next, a determination operation of the semiconductor memory device 10 according to the second embodiment will be described with reference to FIG. 10.

First, operations of step S10 to step S12 will be sequentially performed.

Subsequently, the subtracter 33 calculates a difference between NVt(b) retained in the latch circuit 31 and NVt(a) retained in the counter 30 (step S20), and transmits the calculation results to the comparator 32.

Subsequently, the comparator 32 compares "0", which is issued by the sequencer 15, with the calculation results of the subtracter 33 (step S21).

As a result of the comparison, when the difference between NVt(b) and NVt(a) is 0 (step S21, No), that is, when NVt(a) is equal to NVt(b), the comparator 32 transmits information indicating "non-deterioration of memory cells" to the register 17, and the register 17 retains the information (step S22). After step S22 is completed, the processing proceeds to step S28 (described below).

Meanwhile, when the difference between NVt(b) and NVt(a) is greater than 0 (step S21, Yes), that is, when NVt(b) is greater than (or smaller than) NVt(a), the comparator 32 compares a value "N" (N is an integer which exceeds "0"), which is issued by the sequencer 15, with the calculation results of the subtracter 33 (step S23).

As a result of the comparison, when the difference is equal to or smaller than N (step S23, No), the comparator 32 transmits information indicating "cell deterioration level 1" to the register 17, and the register 17 retains the information (step S24). After step S24 is completed, the processing proceeds to step S28.

Meanwhile, when the difference is greater than N (step S23, Yes), the comparator 32 compares a value "M" (M is an integer which exceeds N), which is issued by the sequencer 15, with the calculation results of the subtracter 33 (step S25).

As a result of the comparison, when the difference is equal to or smaller than M (step S25, No), the comparator 32 transmits information indicating "cell deterioration level 2" to the register 17, and the register 17 retains the information (step S26). After step S26 is completed, the processing proceeds to step S28.

Meanwhile, when the difference is greater than M (step S23, Yes), the comparator 32 transmits information indicating "warning of cell deterioration" to the register 17, and the register 17 retains the information (step S27).

Subsequently, the sequencer 15 outputs a message to the controller 20 or the external host apparatus, based on the information retained in the register 17 (step S28), and then, the determination operation is ended.

2-3. Advantage of Second Embodiment

According to the determination operation of the semiconductor memory device 10 of the second embodiment, the deterioration state of the memory cells is indicated by multiple deterioration levels. Specifically, in the same manner as in the first embodiment, the number of the activated memory cells is counted during data reading of the same page with the read voltage Vt(a) and Vt(b), and subsequently, a difference between NVt(a) and NVt(b), which are the counting results, is calculated. Then, the difference between NVt(a) and NVt(b) is compared with the value which is issued by the sequencer 15. For example, when the sequencer issues "0" and NVt(a) is equal to NVt(b), it is determined that "non-deterioration of memory cells" is to be output. When NVt(a) is different from NVt(b), the sequencer 15 then issues "N". In addition, when the difference between NVt(a) and NVt(b) is equal to or less than N, it is determined that "cell deterioration level 1" is to be output. When the difference between NVt(a) and NVt(b) is greater than N, the sequencer 15 continuously issues "M". In addition, when the difference between NVt(a) and NVt(b) is equal to or less than M, it is determined that "cell deterioration level 2" is to be output. When the difference between NVt(a) and NVt(b) is greater than M, it is determined that "cell deterioration warning level" is to be output. In this way, the semiconductor memory device 10, based on the difference between NVt(a) and NVt(b) which corresponds to the number of the memory cells that deteriorate in the same page, indicated the deterioration level by three levels of "cell deterioration level 1", "cell deterioration level 2", and "cell deterioration warning level". Then, the semiconductor memory device 10 outputs a message corresponding to the determination results to the controller 20.

According to the second embodiment, it is possible to manage the deterioration level of memory cells in the blocks BLK in more detail. Further, based on the deterioration level, since the block BLK including a page of the cell deterioration level 2 has lower reliability than that of the block BLK including a page of the cell deterioration level 1, it is possible to use the block BLK including the page of the cell deterioration level 1 (more particularly, the page of the deterioration level 1) is used for data writing more preferentially than the block BLK including the page of the cell deterioration level 2 (more particularly, the page of the deterioration level 2). In this way, data writing based on the deterioration level of the memory cells can be carried out, whereby it is possible to increase reliability of the semiconductor memory device 10.

In the second embodiment, the deterioration level of the memory cells is divided into three levels. However, embodiments are not limited thereto, and various modifications can be made. In addition, it is also possible to modify the specification of the deterioration level after the semiconductor memory device is shipped.

In addition, the value used for comparing with the difference between NVt(a) and NVt(b) may not be issued by the sequencer 15. For example, the register 17 may retain "N" and and the values retained in the register 17 in the determination operation may be referred to.

3. Third Embodiment

Next, a semiconductor memory device according to a third embodiment and a control method thereof will be described. In the third embodiment, a bad block flag is set based on the determination results of the determination operation described in the first and second embodiments. Hereinafter, only the points which differ from those in the first and second embodiments will be described.

3-1. Determination Operation

Figure 11:
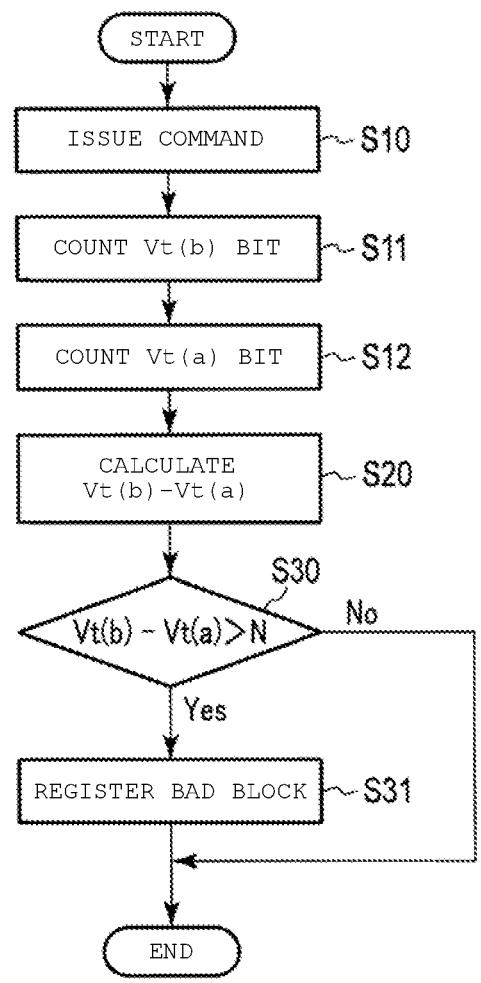
FIG. 11 is a flowchart of a determination operation carried out by a semiconductor memory device according to a third embodiment.

A determination operation of the semiconductor memory device 10 according to the third embodiment will be described with reference to FIG. 11.

First, operations of step S10 to step S12, and step S20 will be sequentially performed.

Subsequently, the comparator 32 compares the value "N" which is issued by the sequencer 15 with the calculation results of the subtracter 33 (step S30).

As a result of the comparison, when the difference between NVt(b) and NVt(a) is equal to or smaller than N (step S30, No), the comparator 32 transmits information indicating "non-deterioration of memory cells" to the register 17, and then, the determination operation is ended.

Meanwhile, when the difference between NVt(b) and NVt(a) is greater than N (step S30, Yes), the comparator 32 transmits information indicating "warning of cell deterioration" to the register 17, and the register 17 retains the information. Subsequently, the sequencer 15 sets a BBF corresponding to the block BLK which is designated as a block of "warning of cell deterioration" to the row decoder 12, based on the memory cell information which is retained in the register 17 (step S31), and then, the determination operation is ended.

3-2. Advantage of Third Embodiment

In the determination operation of the semiconductor memory device 10 according to the third embodiment, when a deteriorated memory cell is detected, the block BLK having the deteriorated memory cell is prevented from being used in the subsequent processing. Specifically, when the number of defective bits determined in the determination operation exceeds a predetermined value, a BBF corresponding to the block BLK including the memory cell is set to the row decoder 12.

By doing so, it is possible to avoid the deteriorated memory cell from being used thereafter, and to increase reliability of the semiconductor memory device 10. In addition, according to the determination operation of the third embodiment, the BBF is set internally (on its determination) in the semiconductor memory device 10, and thus, it is possible to increase the operation speed, compared to a case in which the controller 20 issues a command so as to set the BBF to the semiconductor memory device 10.

Meanwhile, before the BBF is set in the determination operation, the data stored in the block BLK are moved to another block BLK with no deterioration or smaller deterioration. In addition, a message may be output to the controller 20, together with setting of the BBF.

In addition, the BBF which is set in the semiconductor memory device 10 is maintained in the semiconductor memory device 10 (for example, ROM fuse) until power is disconnected from the memory system 1. Setting of the BBF may be performed immediately after, for example, the determination operation is performed, and may be performed when the semiconductor memory device 10 is idle. Timing at which the BBF is set to the semiconductor memory device 10 is not limited to this, and can be variously modified.

The semiconductor memory device 10 according to at least one of the above embodiments includes the memory cell array (11, FIG. 2) which includes multiple memory cells, and the determination circuit (16, FIG. 2). The determination circuit 16 counts the number of activated cells or the number of deactivated cells, when the first voltage (Vt(a), FIG. 4) which is used for determining a first threshold ("1" data, FIG. 4) of the memory cell is applied to a gate of the memory cell, and counts the number of activated cells or the number of deactivated cells, when the second voltage (Vt(b), FIG. 4) which is used for determining the first threshold and is different from the first voltage Vt(a) is applied to the gate of the memory cell. In addition, the determination circuit compares the first counting result (NVt(a), FIG. 7) corresponding to the first voltage Vt(a) with the second counting result (NVt(b), FIG. 7) corresponding to the second voltage Vt(b).

Accordingly, it is possible to manage the deterioration state of the memory cells.

Meanwhile, embodiments are not limited to the first and second embodiments, and can be variously modified.

For example, the configuration of the determination circuit 16 is an example, and not limited thereto. For example, after NVt(a) and NVt(b) which are the counting results are respectively retained in different latch circuits, NVt(a) and NVt(b) may be input to the comparator 32 or the subtracter 33. In addition, a latch circuit may be provided between the subtracter 33 and the comparator 32.

In addition, the order of the steps described in the flowchart can be changed.

In addition, the above embodiments can also be applied to a memory cell which retains multi-level data. In addition, the NAND-type flash memory according to the above embodiments employs a floating gate, but the configuration of the NAND-type flash memory is not limited thereto. For example, a metal-oxide-nitride-oxide-semiconductor (MONOS) transistors may be used for the NAND-type flash memory.

In addition, determination of the deterioration state of the memory cell may also be performed by the controller 20. For example, the semiconductor memory device 10 may transmit the counting results NVt(a) and NVt(b), or a result obtained by calculating the difference between NVt(a) and NVt(b) to the controller 20, and the controller 20 may determine the deterioration state of the memory cell, based on the value.

In addition, the above embodiments can also be applied to a NAND-type flash memory in which memory cells are three-dimensionally stacked. A configuration of the memory cell array 11 is described in, for example, U.S. patent application Ser. No. 12/407,403 filed on Mar. 19, 2009 and entitled "THREE-DIMENSIONALLY STACKED NON-VOLATILE SEMICONDUCTOR MEMORY". In addition, the configuration of the memory cell array 11 is described in, for example, U.S. patent application Ser. No. 12/406,524 filed on Mar. 18, 2009 and entitled "THREE-DIMENSIONALLY STACKED NON-VOLATILE SEMICONDUCTOR MEMORY", U.S. patent application Ser. No. 12/679,991 filed on Mar. 25, 2010 and entitled "NON-VOLATILE SEMICONDUCTOR MEMORY DEVICE AND MANUFACTURING METHOD THEREOF", and U.S. patent application Ser. No. 12/532,030 filed on Mar. 23, 2009 and entitled "SEMICONDUCTOR MEMORY AND MANUFACTURING METHOD THEREOF". All the patent applications are incorporated in the present specification by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell unit including a plurality of blocks, each of the blocks including a plurality of pages; and
   a circuit configured to
   count a number of activated or non-activated memory cells in one or more pages when a first voltage is applied to gates of memory cells of said one or more pages to read data therefrom,
   count a number of activated or non-activated memory cells in said one or more pages when a second voltage different from the first voltage is applied to the gates of the memory cells of said one or more pages to read data therefrom,
   compare the counted numbers, and
   store, in a register, data about deterioration of the memory cells of said one or more pages depending on a comparison result.

2. The semiconductor memory device according to claim 1, wherein when a difference between the counted number is smaller than a predetermined value, data indicating no deterioration of the memory cells of said one or more pages is stored in the register, and when the difference is greater than the predetermined value, data indicating deterioration of the memory cells of said one or more pages are stored in the register.

3. The semiconductor memory device according to claim 2, further comprising:
a row decoder configured to select a page to be accessed, wherein
a flag is set, in the row decoder, for a block including said one or more pages when the difference is greater than the predetermined value.

4. The semiconductor memory device according to claim 3, wherein
the setting of the flag prevents the row decoder from selecting pages of the block for which the flag has been set.

5. The semiconductor memory device according to claim 3, further comprising:
a sequencer configured to move data stored in the block for which the flag is set, to another block.

6. The semiconductor memory device according to claim 3, wherein
when the difference is greater than the predetermined value, data indicating that the block including said or more pages is defective are stored in one of the blocks.

7. The semiconductor memory device according to claim 2, wherein
when the difference is greater than the predetermined value and smaller than a second predetermined value, data indicating that the memory cells of said one or more pages are in a first deterioration level are stored in the register, and
when the difference is greater than the second predetermined value, data indicating that the memory cells of said one or more pages are in a second deterioration level that is worse than the first deterioration level are stored in the register.

8. The semiconductor memory device according to claim 1, wherein
the circuit is further configured to select said one or more pages for which the numbers of activated or non-activated memory cells are counted, based on a command received from a controller connected to the semiconductor memory device.

9. The semiconductor memory device according to claim 1, wherein
the circuit is further configured to select, on its own determination, said one or more pages for which the numbers of activated or non-activated memory cells are counted.

10. The semiconductor memory device according to claim 9, wherein
the circuit selects said one or more pages based on a number of data write times or data read times with respect to each of the pages of the blocks of the memory cell unit.

11. An operation method of a semiconductor memory device including a memory cell unit including a plurality of blocks, each of the blocks including a plurality of pages, the method comprising:
counting a number of activated or non-activated memory cells in one or more pages when a first voltage is applied to gates of memory cells of said one or more pages to read data therefrom;
counting a number of activated or non-activated memory cells in said one or more pages when a second voltage different from the first voltage is applied to the gates of the memory cells of said one or more pages to read data therefrom;
comparing the counted numbers; and
storing, in a register, data about deterioration of the memory cells of said one or more pages depending on a comparison result.

12. The operation method according to claim 11, further comprising:
when a difference between the counted number is smaller than a predetermined value, storing data indicating no deterioration of the memory cells of said one or more pages, in the register; and
when the difference is greater than the predetermined value, storing data indicating deterioration of the memory cells of said one or more pages, in the register.

13. The operation method according to claim 11, further comprising:
when the difference is greater than the predetermined value, setting, in a row decoder of the semiconductor memory device, a flag for a block including said one or more pages.

14. The operation method according to claim 13, wherein the setting of the flag prevents the row decoder from selecting pages of the block for which the flag has been set.

15. The operation method according to claim 13, further comprising:
moving data stored in the block for which the flag is set, to another block.

16. The operation method according to claim 13, further comprising:
when the difference is greater than the predetermined value, storing data indicating that the block including said or more pages is defective, in one of the blocks.

17. The operation method according to claim 12, wherein
when the difference is greater than the predetermined value and smaller than a second predetermined value, data indicating that the memory cells of said one or more pages are in a first deterioration level are stored in the register, and
when the difference is greater than the second predetermined value, data indicating that the memory cells of said one or more pages are in a second deterioration level that is worse than the first deterioration level are stored in the register.

18. The operation method according to claim 11, further comprising:
selecting said one or more pages for which the numbers of activated or non-activated memory cells are counted, based on a command received from a controller connected to the semiconductor memory device.

19. The operation method according to claim 11, further comprising:
selecting, on its own determination, said one or more pages for which the numbers of activated or non-activated memory cells are counted.

20. The operation method according to claim 19, wherein said one or more pages are selected based on a number of data write times or data read times with respect to each of the pages of the blocks of the memory cell unit.

* * * * *